(12) United States Patent
Choi

(10) Patent No.: US 8,897,069 B2
(45) Date of Patent: Nov. 25, 2014

(54) SEMICONDUCTOR MEMORY DEVICE AND OPERATING METHOD THEREOF

(75) Inventor: Jea Won Choi, Gongju-si (KR)

(73) Assignee: SK Hynix Inc., Gyeonggi-do (KR)

( * ) Notice: Subject to any disclaimer, the term of this patent is extended or adjusted under 35 U.S.C. 154(b) by 195 days.

(21) Appl. No.: 13/601,098

(22) Filed: Aug. 31, 2012

(65) Prior Publication Data

US 2013/0286746 A1  Oct. 31, 2013

(30) Foreign Application Priority Data

Apr. 27, 2012 (KR) .................. 10-2012-0044628

(51) Int. Cl.
*G11C 11/34* (2006.01)

(52) U.S. Cl.
USPC ............ 365/185.11; 365/185.12; 365/185.17; 365/185.19; 365/185.21; 365/185.22

(58) Field of Classification Search
USPC ............. 365/185.11, 185.12, 185.17, 185.19, 365/185.21, 185.22
See application file for complete search history.

(56) References Cited

U.S. PATENT DOCUMENTS

| 6,580,644 | B1 * | 6/2003 | Chung | 365/185.22 |
| 6,845,041 | B2 * | 1/2005 | Lee | 365/185.17 |
| 7,983,079 | B2 * | 7/2011 | Kim | 365/185.22 |
| 8,085,587 | B2 * | 12/2011 | Lim | 365/185.22 |

FOREIGN PATENT DOCUMENTS

| KR | 1020100089508 A | 8/2010 |
| KR | 1020110001073 A | 1/2011 |

* cited by examiner

*Primary Examiner* — Trong Phan
(74) *Attorney, Agent, or Firm* — William Park & Associates Patent Ltd.

(57) ABSTRACT

A semiconductor memory device of the present invention includes a memory cell array configured to include a sensing circuit configured to perform program verifying of the page buffer group selected by the select signal, and configured to output a pass/fail signal corresponding to the page buffer group, a verifying result signal generation section configured to output one or more of a first verifying signal and a second verifying signal in accordance with pass or fail of the program for total page buffer groups by using the pass/fail signal, and a control circuit configured to output the select signals to verify the program after the program is performed, and control operation of the program in response to an output signal of the verifying result signal generation section.

9 Claims, 5 Drawing Sheets

US 8,897,069 B2

SEMICONDUCTOR MEMORY DEVICE AND OPERATING METHOD THEREOF

CROSS-REFERENCE TO RELATED APPLICATION

This application claims priority from Korean Patent Application No. 10-2012-0044628, filed on Apr. 27, 2012, the contents of which are incorporated herein by reference in its entirety.

BACKGROUND

1. Field of Invention

The present invention relates to a semiconductor memory device and an operating method thereof.

2. Description of Related Art

A semiconductor memory device performs a program verifying method of verifying whether or not a program operation is being normally performed.

The semiconductor memory device verifies through the program verifying method only on whether or not the program of every memory cell coupled to selected page is finished in the initial stages. However, a program verifying method, of counting the number of memory cells of which the program is not finished of every memory cell coupled to the selected page, has been developed.

A current sensing method, which is one of the various program verifying methods, may sense the number of failed memory cells in a comparatively rapid time of period, and thus it has been widely used. However, a problem exists in that accuracy of the current sensing method starts to deteriorate in proportion to a rapid velocity because the current sensing method receives a united program verifying result of every memory cell coupled to the selected pages.

Specially, a method of counting more accurately the number of failed memory cells with performing a program verifying operation in a rapid time of period has been required as the capacity of the semiconductor memory device increases and fine processes are performed.

SUMMARY OF THE INVENTION

Various embodiments provide a semiconductor memory device capable of accurately verifying a fail bit by reducing error range when a current sensing method is used as a program verifying operation of the semiconductor memory device and an operating method thereof.

A semiconductor memory device may include a memory cell array configured to include plural memory cells; page buffer groups coupled to at least one of bit lines coupled to the memory cells, configured to have page buffers for operating when the memory cells are programmed or read, and selected by select signals; a sensing circuit configured to perform program verifying of the page buffer group selected by the select signal, and configured to output a pass/fail signal corresponding to the page buffer group; a verifying result signal generation section configured to output one or more of a first verifying signal and a second verifying signal in accordance with pass or fail of the program for total page buffer groups by using the pass/fail signal; and a control circuit configured to output the select signals to verify the program after the program is performed, and control operation of the program in response to an output signal of the verifying result signal generation section.

A semiconductor memory device may include: a memory cell array configured to include at least one memory cell; page buffer groups coupled to at least one of the memory cells and configured to have at least one page buffer configured to operate when selected by a select signal and when the memory cell is programmed or read; a fail checking circuit configured to perform program verifying of the page buffer group selected by the select signal; and a control circuit configured to output the select signal to verify the memory cell is programmed after the programming of the memory cell is performed, and in response to an output signal of the fail checking circuit.

A semiconductor memory device and an operating method thereof according to an embodiment may reduce the number of sensed fail bits by adding a sensing circuit in the process of verifying the fail bit through a current sensing method in the program verifying operation, thereby enhancing accuracy of the program verifying operation.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION

Hereinafter, various embodiments will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

Figure 1:
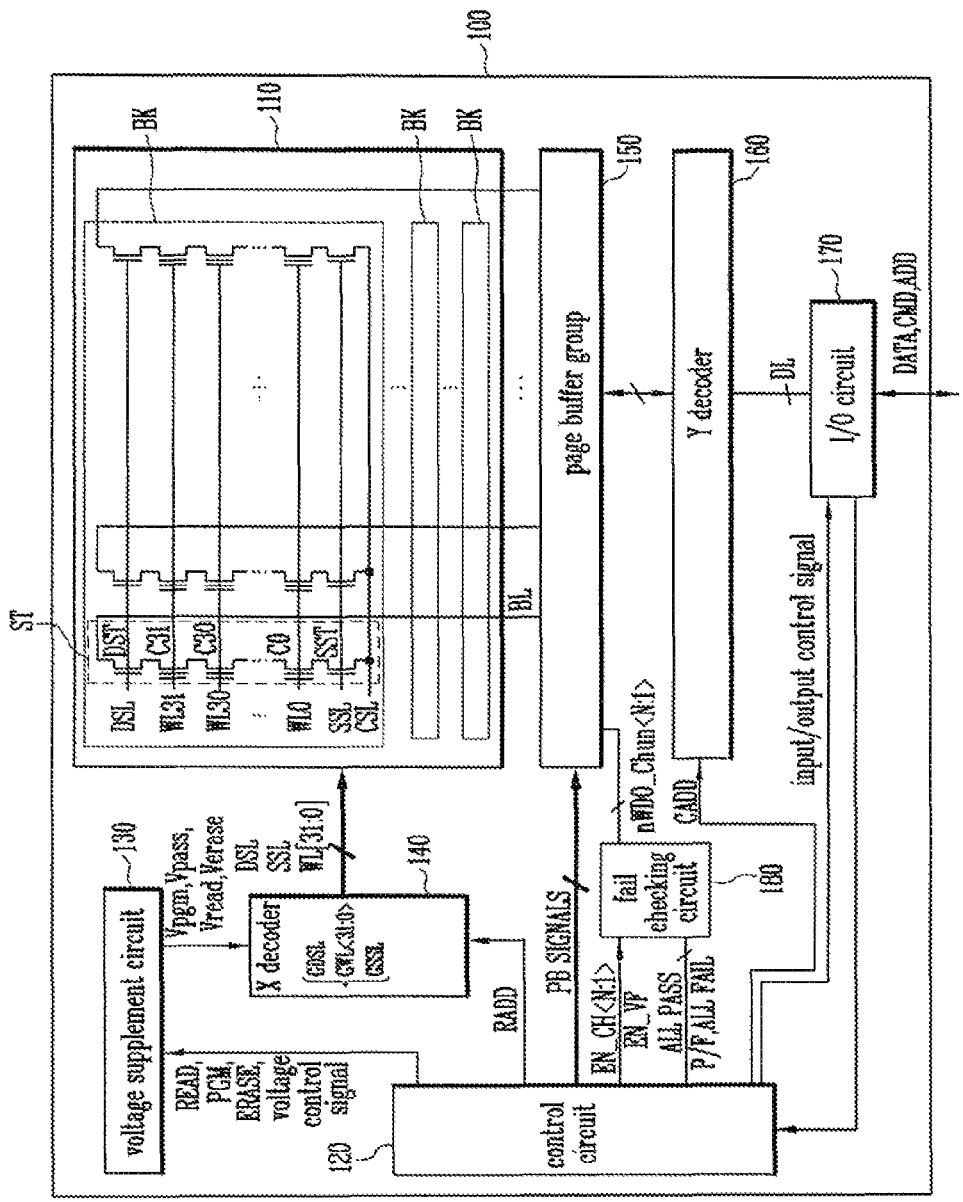
FIG. 1 is a view illustrating a semiconductor memory device according to an embodiment.

FIG. 1 is a view illustrating a semiconductor memory device according to an embodiment.

In FIG. 1, a semiconductor memory device 100 may include a memory cell array 110 a peripheral circuit group 130 to 180, and a control circuit 120 for controlling the peripheral circuit group 130 to 180.

The memory cell array 110 may include a plurality of memory blocks BK, and each of the memory blocks BK may have a plurality of cell strings ST.

Each of the cell strings ST may include 0th memory cell C0 to thirty-first memory cell C31 coupled in serial between a drain select transistor DST and a source select transistor SST.

A gate of the drain select transistor DST may be coupled to a drain select line DSL, and a gate of the source select transistor SST may be coupled to a source select line SSL. Gates of the 0th memory cell C0 to the thirty-first memory cell C31 may be coupled to the 0th word line WL0 to the thirty-first word line WL31, respectively.

A drain of the drain select transistor DST may be coupled to a bit line BL, and a source of the source select transistor SST may be coupled to a common source line CSL.

The peripheral circuit group 130 to 180 may include a voltage supplement circuit 130, an X decoder 140, a page buffer group 150, a Y decoder 160, an I/O circuit 170, and a fail checking circuit 180.

The voltage supplement circuit 130 may generate an operation voltage, e.g. program voltage Vpgm, a read voltage Vread, a pass voltage Vpass, or an erase voltage Verase, etc. for programming, reading or erasing in response to a voltage control signal and operation mode signals PGM (program), READ, ERASE, etc. outputted from the control circuit 120.

The X decoder 140 may select one of the memory blocks BK in the memory cell array 110 according to a row address RADD provided from the control circuit 120, and connects, respectively, word lines WL[31:0] and select line SSL, DLS of selected memory block BK to global lines GWL[31:0], GSSL, GDSL to deliver the operation voltage.

Figure 2:
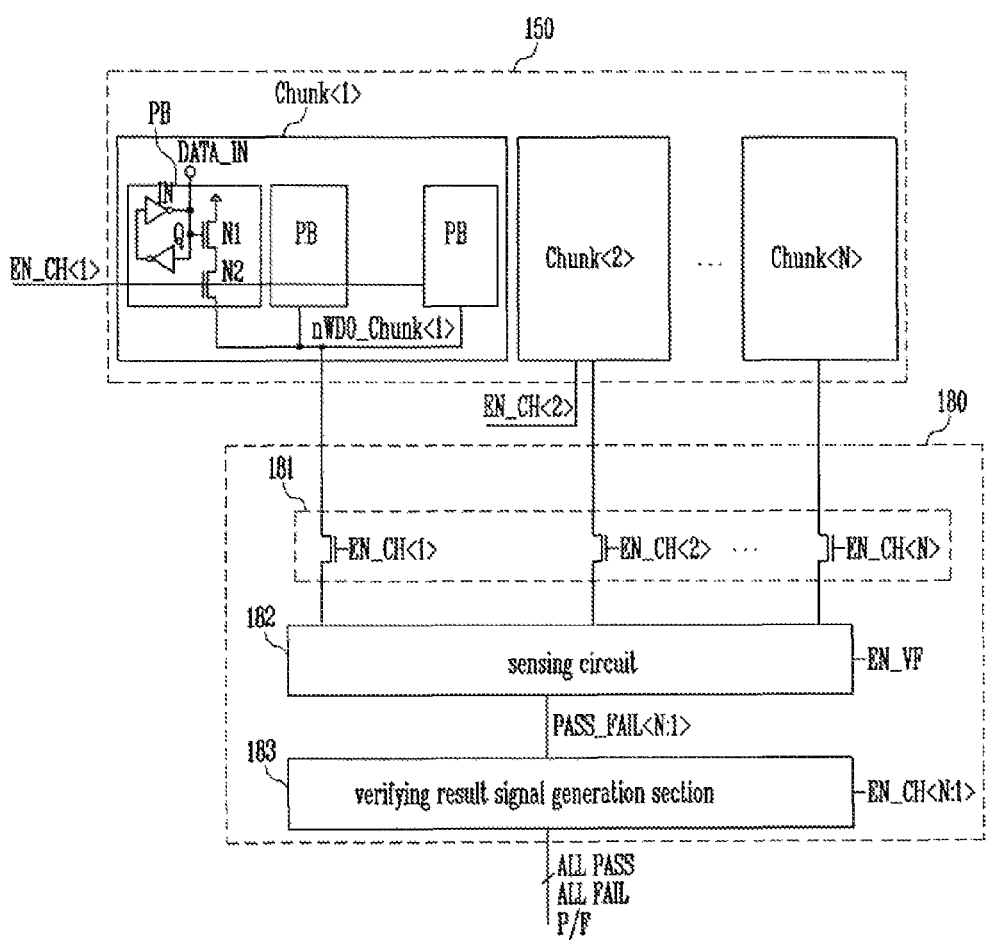
FIG. 2 is a view illustrating connection relation of a page buffer group and a fail checking circuit in FIG. 1.

The page buffer group 150 may include a first to an Nth chunks Chunk<N:1> referring FIG. 2, and each of the chunks may have page buffers coupled to at least one of the bit lines. The page buffers in each of the first to the Nth chunks Chunk<N:1> may be coupled in common to a first to an Nth verifying lines nWDO_Chunk<N:1>, respectively.

Each of the first to the Nth chunks Chunk<N:1> may be selected by a first to an Nth chunk select signals EN_CH<N:1>. A program verifying result may be sensed through a verifying line of a selected chunk.

The fail checking circuit 180 may be coupled to a verifying line selected from the first to the Nth verifying lines nWDO_Chunk<N:1> coupled to the first to the Nth chunks Chunk<N:1> according to the first to the Nth chunk select signals EN_CH<N:1>, senses the coupled verifying line using a current sensing method to determine pass/fail of program, and outputs verifying result signals ALL PASS, ALL FAIL, PASS_FAIL<N:1> in accordance with verified result.

The fail checking circuit 180 may operate in response to page buffer control signals PB SIGNALS outputted from the control circuit 120 when a program operation, a read operation, or an erase operation is performed.

The Y decoder 160 may provide a data input/output path of the page buffer group 150 and the I/O circuit 170 in response to a column address CADD outputted from the control circuit 120.

The I/O circuit 170 may receive data from outside or may output data to the outside (i.e., DATA, CMD (command), ADD (address)) in response to an input/output control signal outputted from the control circuit 120.

Hereinafter, connection relation between the page buffer group 150 and the fail checking circuit 180 will be described.

FIG. 2 is a view illustrating connection relation of a page buffer group and a fail checking circuit in FIG. 1.

In FIG. 2, the first to the Nth chunks <N:1> in the page buffer group 150 may include plural page buffers, respectively.

FIG. 2 shows representatively only the page buffers PB in the first chunk Chunk<1> of the first to the Nth chunks <N:1>, and illustrates representatively some of the verifying circuits for the page buffers PB coupled to a first verifying line nWDO_Chunk<1> and included in one page buffer PB.

In FIG. 2, a first NMOS transistor N1 and a second NMOS transistor N2 as the verifying circuit in the page buffer PB may be coupled in serial between a ground node and the first verifying line nWDO_Chunk<1>.

A gate of the first NMOS transistor N1 may be coupled to a node Q of a latch for storing program verifying data, and a first chunk select signal EN_CH<1> may be inputted to a gate of the second NMOS transistor N2. The program verifying data may be input through a data input terminal DATA IN which is coupled to a bit line.

If the node Q in the page buffer PB has a high voltage logic level when programming is passed, the ground node may be coupled to the first verifying line nWDO_Chunk<1> in the case where the first chunk select signal EN_CH<1> is inputted with a high voltage logic level signal.

The node Q in the page buffer PB has low voltage logic level when the programming has failed, and thus the ground node is not coupled to the first verifying line nWDO_Chunk<1> though the first chunk select signal EN_CH<1> and is inputted with a high voltage logic level signal.

The verifying circuit corresponds to resistance. That is, resistance of the first verifying line nWDO_Chunk<1> may increase accordingly as the number of fail bits in the first chunk Chunk<1> augments. Accordingly, if constant current passes through the first verifying line nWDO_Chunk<1>, a voltage of the first verifying line nWDO_Chunk<1> increases accordingly as the number of the fail bits augment.

The fail checking circuit 180 may include a verifying line select circuit 181, a sensing circuit 182, and a verifying result signal generation section 183.

The verifying line select circuit 181 selects one of the first to the Nth verifying lines nWDO_Chunk<N:1> in response to the first to the Nth chunk select signals EN_CH<N:1>, and may connect the selected verifying line to the sensing circuit 182.

The verifying line select circuit 181 may include N NMOS transistors (were N may be any number) coupled between each of the first to the Nth verifying lines nWDO_Chunk<N:1> corresponding to the first to the Nth chunks Chunk<N:1> and the sensing circuit 182, and each of the NMOS transistors may be turned on or turned off in response to the first to the Nth chunk select signals EN_CH<N:1>.

The sensing circuit 182 may provide constant reference current to the verifying line selected by the verifying line select circuit 181 in response to a verifying enable signal EN_VF, and then may output the first to an Nth pass/fail signals PASS_FAIL<N:1> for showing a result of a pass or a fail for the program according to a voltage of the corresponding verifying line. The first to the Nth pass/fail signals PASS_FAIL<N:1> may be signals outputted from an inverter IN, and show information concerning pass/fail of the program of the chunk selected by the first to the Nth chunk select signals EN_CH<N:1>.

As described above, each of the chunks may include the page buffers, and the sensing circuit 182 may verify whether or not the number of the fail bits is smaller than preset number for determining a pass/fail of the program in a unit of a chunk.

For example, in the case where it is predetermined that the program will pass when two or less fail bits occur, it will be determined that the program has failed when three fail bits occur to the chunk.

The verifying result signal generation section 183 may temporarily store the first to the Nth pass/fail signals PASS_FAIL<N:1> inputted according to the first to the Nth chunk select signals EN_Chunk<N:1>, and may output an all pass signal ALL PASS, an all fail signal ALL FAIL, or a pass/fail determination signal P/F.

The verifying result signals ALL PASS, ALL FAIL, P/F outputted from the verifying result signal generation section 183 may be inputted to the control circuit 120. The control circuit 120 may determine the program verifying result by using the inputted verifying result signal ALL PASS, ALL FAIL, P/F, and may control the following program operation.

Hereinafter the sensing circuit 182 will be described below.

Figure 3:
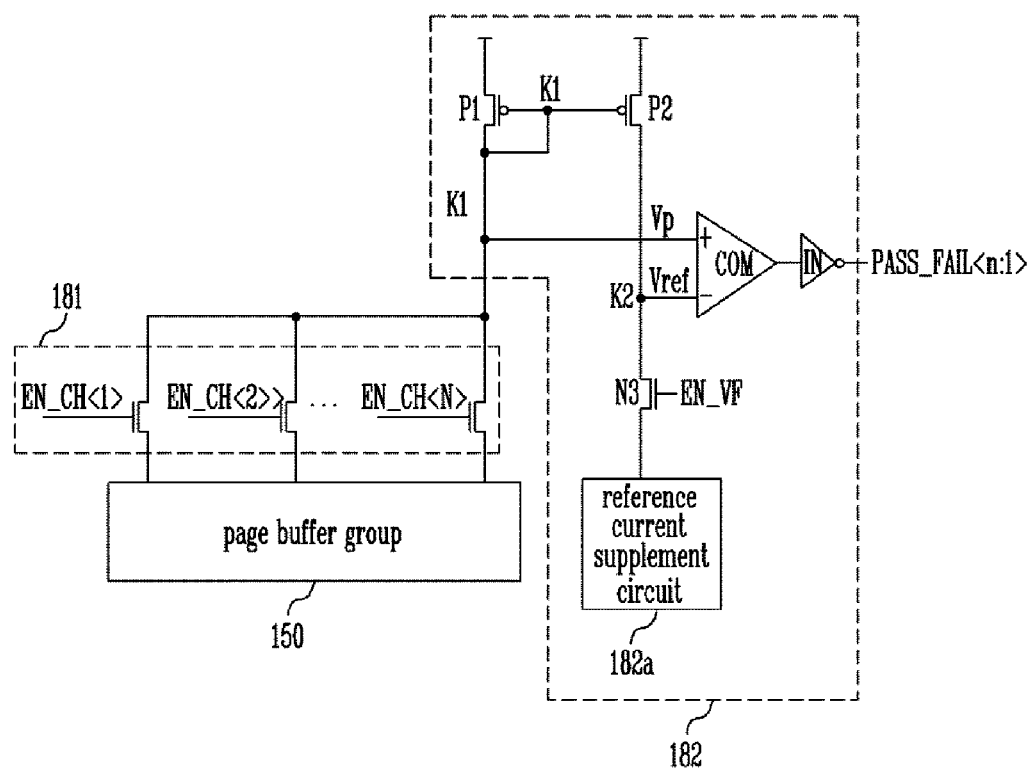
FIG. 3 is a view illustrating circuitry of a sensing circuit in FIG. 2.

FIG. 3 is a view illustrating circuitry of a sensing circuit in FIG. 2.

In FIG. 3, the sensing circuit 182 may include a first PMOS transistor P1, a second PMOS transistor P2, a third NMOS transistor N3, a comparator COM, an inverter IN, and a reference current supplement circuit 182a.

The first PMOS transistor P1 and the second PMOS transistor P2 form a current mirror circuit.

The first PMOS transistor P1 is coupled between a supply voltage input terminal and a node K1, and the second PMOS transistor P2 is coupled between the supply voltage input terminal and a node K2. A gate of the first PMOS transistor P1 and a gate of the second PMOS transistor P2 are coupled in common to the node K1.

The node K1 is coupled to the verifying line, and the third NMOS transistor N3 is coupled between the node K2 and the reference current supplement circuit 182a. The verifying enable signal EN_VF may be inputted to a gate of the third NMOS transistor N3.

The verifying enable signal EN_VF may be enabled to high voltage logic level to sense the program verifying result, and so the third NMOS transistor N3 is turned on. As a result, reference current is provided from the reference current supplement circuit 182a to the node K2.

The reference current provided from the reference current supplement circuit 182a may vary depending on the number of fail bits, wherein the number of fail bits may be used as reference for determining whether or not the program passed.

For example, if it is determined that the program is passed when no fail bit occurs to every page buffer PB in a selected chunk, the reference current has the same intensity as a current passed through the verifying line when program pass data is stored in every page buffer PB of the selected chunk.

Additionally if it is determined that the program is passed though one fail bit occurs to the selected chunk, the reference current has the same intensity as current passing through the verifying line when program fail data is stored in only one page buffer PB of the page buffers PB in the selected chunk and program pass data is stored in the other page buffers PB.

Current having the same intensity as the reference current generated from the reference current supplement circuit 182a may pass through the node K1. A voltage Vp of the node K1 varies according to the number of the fail bit of the selected chunk in the case where constant reference current passes through the node K1.

The comparator COM compares the voltage of the node K1 and a voltage of the node K2, and outputs a pass/fail signal PASS_FAIL corresponding to the selected chunk according to the compared result (i.e., PASS_FAIL<n:1>). An inverse terminal (−) of the comparator COM may be coupled to the node K2 and a non-inverse terminal (+) of the comparator COM may be coupled to the node K1.

The comparator COM may output a signal having a high voltage logic level in the case where the voltage of the node K1 is higher than that of the node K2 and outputs the signal having a low voltage logic level in the case where the voltage of the node K1 is smaller than that of the node K2.

The inverter IN receives the signal outputted from the comparator COM inverses it and then outputs the inverse signal. The signal outputted from the inverter IN is the pass/fail signal PASS_FAIL. In the case where the pass/fail signal PASS_FAIL has a low voltage logic level, it means that the program of the selected chunk has failed. In the case where the pass/fail signal PASS_FAIL has a high voltage logic level, it means that the program of the selected chunk has passed.

Hereinafter, operation of the sensing circuit 182 will be described below.

If it is determined that the program is passed in the case where two or less fail bits occur to a selected chunk, the reference current supplement circuit 182a may provide, current higher than current passing through the verifying line when two fail bits occur and smaller than current passing through the verifying line when three fail bits occur, to the node K2. Resistance of the node K2 is greater than that when two fail bits occur, and it is smaller than that when three fail bits occur. A voltage Vref of the node K2 is determined in accordance with the resistance of the node K2 and the reference current.

Current having the same intensity as current provided from the reference current supplement circuit 182a passes through the node K1 by the first PMOS transistor P1 and the second PMOS transistor P2 forming the current mirror circuit.

In the case where the first chunk Chunk<1> is selected, resistance of the first verifying line nWDO_Chunk<1> may vary according to the program verifying result stored in the page buffers PB selected by the first chunk select signal EN_CH<1>, and the voltage Vp of the node K1 may be determined by the corresponding resistance and the current passing through the node K1.

For example, it may be determined that the program is passed in the case where the two fail bits occur. The resistance of the node K2 in accordance with the reference current supplement circuit 182a is higher than that when two fail bits occur and it is smaller than the resistance when three fail bits occur.

In the case where two fail bits occur, the resistance of the node K1 coupled to the first verifying line nWDO_Chunk<1> is smaller than that of the node K2, and intensity of current passing through the node K1 is identical to that of current passing through the node K2. Accordingly, the voltage Vp of the node K1 is smaller than a voltage Vref of the node K2 according to a voltage theory "V=IR". As a result, the comparator COM outputs the signal having low voltage logic level, and thus the first pass/fail signal PASS_FAIL<1> is outputted with a high voltage logic level from the inverter IN. It is determined that the program is passed in the case where the first pass/fail signal PASS_FAIL<1> has a high voltage logic level.

It should be determined that the program is failed in the case where three fail bits occur. In the case where three fail bits occur, the resistance of the node K1 coupled to the first verifying line nWDO_Chunk<1> is higher than that of the node K2. Accordingly, the voltage Vp of the node K1 is greater than the voltage Vref of the node K2.

The comparator COM may output the signal having a high voltage logic level, and thus the first pass/fail signal PASS_FAIL<1> may be outputted with a low voltage logic level from the inverter IN. It may be determined that the program is a fail in the case where the first pass/fail signal PASS_FAIL<1> has a low voltage logic level.

As described above, the sensing circuit 182 may output in sequence the first to the Nth pass/fail signals PASS_FAIL<N:1> corresponding to the first to the Nth chunks Chunk<N:1> in the case where the first to the Nth chunk select signals EN_CH<N:1> are provided in sequence.

The verifying result signal generation section 183 may output the verifying result signal ALL PASS, ALL FAIL, P/F by using the first to the Nth pass/fail signals PASS_FAIL<N:1> outputted in sequence from the sensing circuit 182. The verifying result signal generation section 183 may have the following circuits in a first embodiment, a second embodiment, and various other embodiments.

Figure 4:
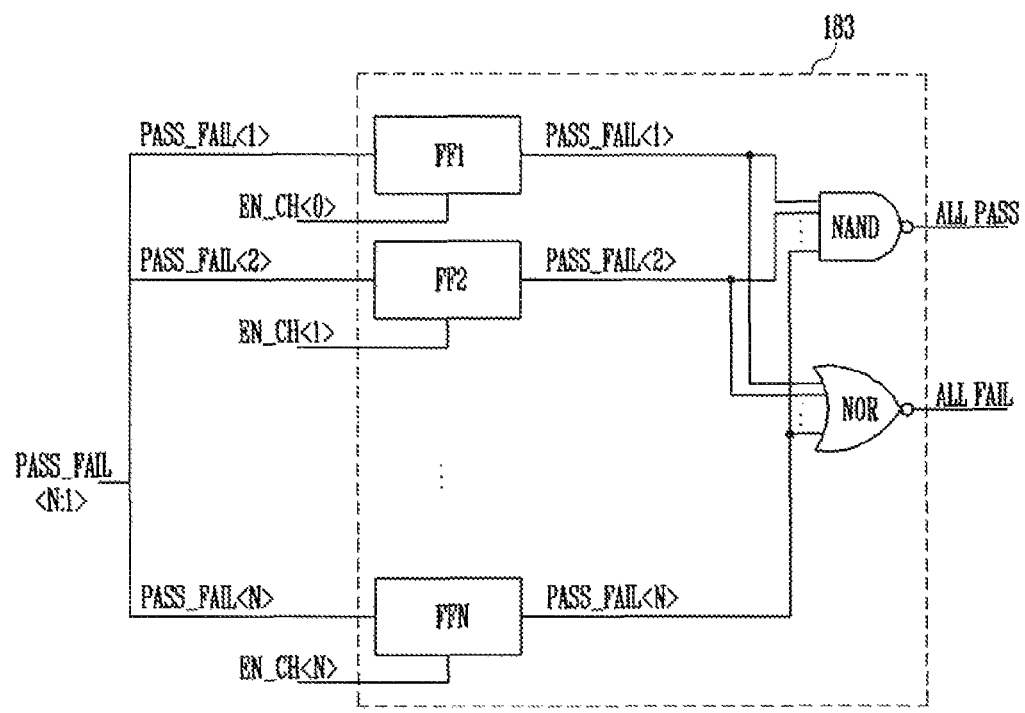
FIG. 4 is a view illustrating a verifying result signal generation section in FIG. 2 according to an embodiment.

FIG. 4 is a view illustrating a verifying result signal generation section in FIG. 2 according to a first embodiment and various other embodiments.

In FIG. 4, the verifying result signal generation section 183 may include a first to Nth flip-flops (FF1 to FFN), a NAND gate NAND, and a NOR gate NOR.

Each of the first to the Nth flip-flops FF1 to FFN may temporarily store the first to the Nth pass/fail signals PASS_FAIL<N:1> outputted from the sensing circuit 182 in response to the first to Nth chunk select signals EN_CH<N:1>.

The first to the Nth flip-flops FF1 to FFN may be composed of a simple latch circuit and may be D flip-flops, etc. for storing and outputting inputted data in response to the first to the Nth chunk select signals EN_CH<N:1>.

The NAND gate NAND may output an all pass signal ALL PASS using the first to the Nth pass/fail signals PASS_FAIL<N:1> corresponding to the first to the Nth chunks Chunk<N:1> and may be stored in the first to the Nth flip-flops FF1 to FFN.

The NAND gate NAND performs NAND operation about inputted signals and outputs the result of the NAND operation. The result is low voltage logic level only when every of the inputted signals has high voltage logic level. In the case where one or more of the inputted signals has a low voltage logic level, the result is a high voltage logic level.

Accordingly, the NAND gate NAND may output the all pass signal ALL PASS having a low voltage logic level in the case where every first to the Nth pass/fail signals PASS_FAIL<N:1> corresponding to the first to the Nth chunks Chunk<N:1> has a high voltage logic level. In the case where the all pass signal ALL PASS has a high voltage logic level, this means that the program for every chunk is not passed.

The NOR gate NOR may perform a NOR operation about the first to the Nth pass/fail signals PASS_FAIL<N:1> stored in the first to the Nth flip-flops FF1 to FFN, and may output the result of the NOR operation. Output of the NOR gate NOR is the all fail signal ALL FAIL.

The NOR operation may output a high voltage logic level only when every inputted signal has a low voltage logic level, and may output a low voltage logic level in the case where one or more of inputted signals has a high voltage logic level. Accordingly, the NOR gate NOR outputs the all fail signal ALL FAIL having a high voltage logic level in the case where every program for the first to the Nth chunks Chunk<N:1> is failed, and outputs the all fail signal ALL FAIL having a low voltage logic level in the case where at least one of program for the chunks is passed.

The all pass signal ALL PASS and the all fail signal ALL FAIL are used as described below.

The control circuit 120 may determine firstly pass/fail of the program by using the all pass signal ALL PASS. It is determined that the program for every chunk is passed in the case where the all pass signal ALL PASS has a low voltage logic level, and so any further verifying is not needed. The control circuit 120 may output control signals to finish present program operation or perform following program operation.

However, it is determined that the program for every chunk is not passed in the case where the all pass signal ALL PASS has a high voltage logic level. This means that the program for one or more chunk is failed. However, there's no saying that the program for every chunk is failed.

Accordingly, the control circuit 120 may verify through the all fail signal ALL FAIL whether or not the program for every chunk is failed. Following the second embodiment may include a circuit for detecting the number of chunks for which the program is failed, and so pass/fail of the program may be more definitely determined through the circuit.

The verifying result signal generation circuit 183 in the second embodiment may verify accurately the number of the chunks for which the program is failed.

Figure 5:
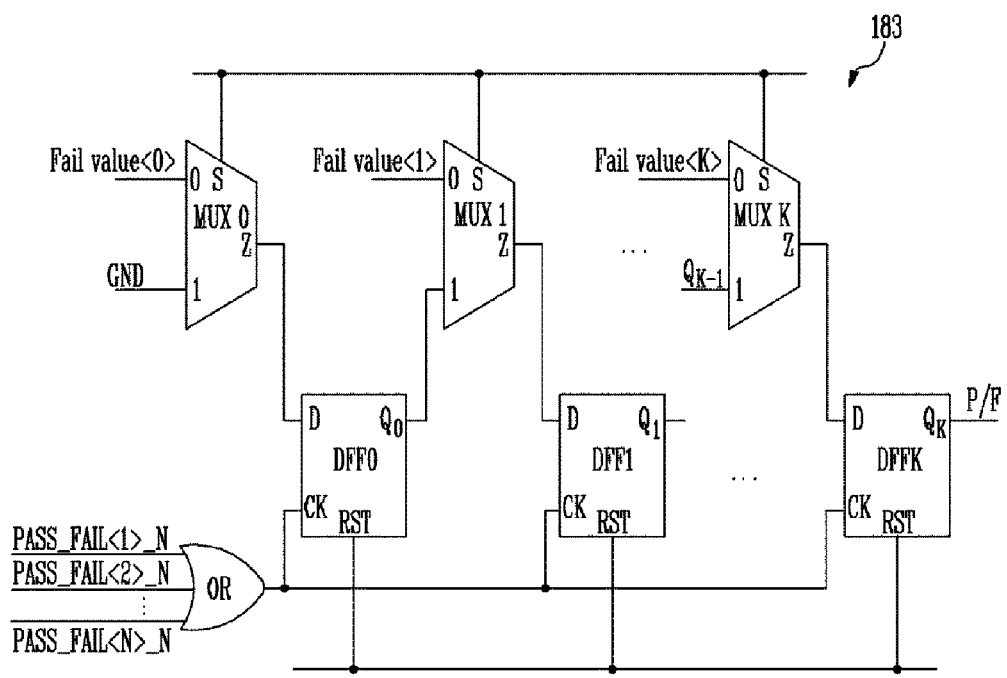
FIG. 5 is a view illustrating a verifying result signal generation section in FIG. 2 according to an embodiment.

FIG. 5 is a view illustrating a verifying result signal generation section in FIG. 2 according to a second embodiment and various other embodiments.

In FIG. 5, the verifying result signal generation section 183 of the second embodiment may include a 0th to a Kth multiplexers Mux<K:0>, a 0th to a Kth D flip-flops DFF<K:0>, and an OR gate OR.

The number of the 0th to the Kth multiplexers Mux<K:0> may be identical to that of the chunks or be smaller than that of the chunks.

Each of the 0th to the Kth multiplexers Mux<K:0> may output selectively a signal inputted to '0' terminal and a signal inputted to '1' terminal through 'Z' terminal according to a signal inputted to 'S' terminal.

A mux control signal Mux_cont (not shown) is inputted to the 'S' terminals of the 0th to the Kth multiplexers Mux<K:0>. The mux control signal Mux_cont may set data in the 0th to the Kth multiplexers Mux<K:0> to a low voltage logic level at initial and then is fixed to a high voltage logic level, and it is one of the control signals outputted from the control circuit 120.

A 0th to a Kth fail setting values Fail value<K:0> may be inputted to '0' terminals of the 0th to the Kth multiplexers Mux<K:0>, respectively. The 0th to the Kth fail setting values Fail value<K:0> may be determined according to the number of the chunks for which fail of the program may occur, and they are set in sequence from the Kth fail setting value Fail value<K>.

If it is determined that the program is passed though fail of the program of two chunks occurs, a (K–1)th and the Kth fail setting values Fail value<K:K–1> are set to '1', and the other fail setting values Fail value<K–2:0> are set to '0'.

If it is determined that the program is passed though fail of the program of three chunks occurs, a (K–2)th to the Kth fail setting values Fail value<K:K–2> are set to '1'.

'1' terminal of the 0th multiplexer Mux0 may be coupled to ground. That is, '0' may be inputted to '1' terminal of the 0th multiplexer Mux0.

'1' terminals of the first to the Kth multiplexers Mux<K:1> may be coupled to output terminals Q<K–1:0> of the 0th to the (K–1)th D flip-flops DFF<K–1:0>, respectively.

D terminals as input terminals of the 0th to the Kth D flip-flops DFF<K:0> may be coupled to output terminals of the 0th to the Kth multiplexers Mux<K:0>, respectively.

Output of the Kth D flip-flop DFF<K> disposed finally corresponds to the pass/fail determination signal P/F. It is determined that the program is passed in the case where the pass/fail determination signal P/F has a high voltage logic level, and it is determined that the program is failed in the case where the pass/fail determination signal P/F has a low voltage logic level.

A shift enable signal Shift_en (not shown) is inputted to clock signal input terminals CK of the 0th to the Kth D flip-flops DFF<K:0>.

The shift enable signal Shift_en is an output signal of an OR gate OR. The OR gate OR performs OR operation about inverted first to Nth pass/fail signals PASS_FAIL<N:1>_N.

Hereinafter, operation of the verifying result signal generation section 183 will be described in detail.

It is assumed that the number of the chunks of which fail is allowable is one and the number of the chunks to which fail of the program occurs is really two. This means that the program is passed though fail of the program occurs to one chunk.

Accordingly, the verifying result signal generation section 183 should output the pass/fail signal P/F having a low voltage logic level.

In the case where K is 2, the verifying result signal generation section 183 may include the 0th to the second multiplexers Mux<2:0> and the 0th to the second D flip-flops DFF<2:0>.

Final two values of fail setting values are set to '1'. That is, a 0th fail setting value Fail value<0> is '0', a first fail setting value Fail value<1> is '1', and a second fail setting value Fail value<2> is '1'. This is for verifying whether or not fail of the program occurs to two chunks because it is determined that the program is passed when fail occurs to one chunk and it is determined that the program is failed when fail occurs to two chunks.

The fail setting values inputted to '0' terminals of the 0th to the second multiplexers Mux<2:0> are outputted through output terminals 'Z' when the mux control signal Mux_cont has a low voltage logic level at initial. As a result, outputs of the 0th to the second D flip-flops DFF<2:0> are '011'.

Subsequently, the level of the mux control signal Mux_cont is changed to a high voltage logic level, and the 0th to the second multiplexers Mux<2:0> output signals inputted to '1' input terminals through 'Z' output terminals. Accordingly, the first and the second multiplexers Mux<2:1> output signals provided from output terminals of the 0th and the first D flip-flops DFF<1:0>.

Since the inverted first to the Nth pass/fail signals PASS_FAIL<N:1>_N are set to have a low voltage logic level at initial, the shift enable signal Shift_en has a low voltage logic level.

The verifying of the program is performed about the first chunk Chunk<1>, and the first pass/fail signal PASS_FAIL<1> is outputted with a high voltage logic level or a low voltage logic level according to the program verifying result.

In the case where it is verified that the program of the first chunk Chunk<1> is passed, the first pass/fail signal PASS_FAIL<1> has a high voltage logic level. The inverted first pass/fail signal PASS_FAIL<1>_N has a low voltage logic level. Accordingly, the shift enable signal Shift_en maintains a low voltage logic level.

In the case where it is verified that the program of the second chunk Chunk<2> is failed, the second pass/fail signal PASS_FAIL<2> has a low voltage logic level, and the inverted second pass/fail signal PASS_FAIL<2>_N has a high voltage logic level. Accordingly, the shift enable signal Shift_en is changed into high voltage logic level.

As a result, the second D flip-flop DFF<2> outputs '1' inputted through the input terminal D. In other words, the pass/fail determination signal P/F is '1'. This is because output of the first D flip-flop DFF<1> is 1.

Outputs of the 0th to the second D flip-flops DFF<2:0> are '011' through shifting in a right direction.

In the case where the program of the third chunk Chunk<3> is also failed, outputs of the 0th to the second D flip-flops DFF<2:0> are '000'. That is, output of the second D flip-flop DFF<2> is '0'. It is determined that the program is failed because the pass/fail determination signal P/F has a low voltage logic level.

The verifying result signal generation section 183 according to the second embodiment and various other embodiments may verify the number of the chunks to which fail of the program occurs. It is important to verify the number of the chunks to which fail of the program occurs when the program of selected page is verified.

For example, when the page buffer group 150 may include five chunks, it is determined that the program is passed in the case where program of one bit in each of the chunks is failed. That is, it is determined that the program is failed in the case where program of two bits in each of the chunks is failed.

It is determined that the program is passed in the case where fail of six bits occur in total pages.

If the program of two chunks is failed, the number of failed bit in total pages is smaller than six when each of the failed chunks has two failed bits.

In other words, though fail of the program occurs to two chunks, the number of total failed bits is smaller than six. In this case, it is determined that the program is passed because error of data may be amended in reality.

To enhance more accuracy of the verifying of the program, the program may be verified through combination of the first embodiment and the second embodiment about the verifying result signal generation section 183 in FIG. 4 and FIG. 5.

In other words, more accurate verifying result may be obtained by verifying the program through combination of the total pass signal ALL PASS, the total fail signal ALL FAIL and the pass/fail determination signal P/F in a unit of the chunks.

If the program is totally passed by the total pass signal ALL PASS, the program operation may be stopped.

If it is determined that the program is not totally passed by the total pass signal ALL PASS, it may be verified whether or not the program is totally failed by using the total fail signal ALL FAIL. If the program is totally failed, the program operation may be continuously performed through an incremental step pulse program ISPP method.

However, if the program is not totally failed, pass or fail of the program may be verified again by using the pass/fail determination signal P/F in a unit of the chunk. Accordingly, since the verifying of the program is determined more accurately, the semiconductor memory device may reduce the program operation not needed with enhancing performance of the program.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:
1. A semiconductor memory device comprising:
 a memory cell array configured to include plural memory cells;
 page buffer groups coupled to at least one of bit lines coupled to the memory cells, configured to have page buffers in order to program or read the memory cells, and selected by select signals;
 a sensing circuit configured to perform program verifying of the page buffer group selected by the select signal, and configured to output a pass/fail signal corresponding to the page buffer group;
 a verifying result signal generation section configured to output one or more of a first verifying signal and a second verifying signal in accordance with pass or fail of the program for total page buffer groups by using the pass/fail signal; and
 a control circuit configured to output the select signals to verify the program after the program is performed, and control operation of the program in response to an output signal of the verifying result signal generation section.

2. The semiconductor memory device of claim 1, wherein the sensing circuit determines verifying result of the program by sensing current of a verifying line coupled to the page buffer group selected by the select signal.

3. The semiconductor memory device of claim 1, wherein the verifying result signal generation section includes:

a first logical gate for outputting a first verifying signal for determining whether or not the program is totally passed according to a result of a NAND operation of the pass/fail signals corresponding to the page buffer groups outputted from the sensing circuit; and a second logical gate for outputting a second verifying signal for determining whether or not the program is totally passed according to a result of a NOR operation of the pass/fail signals corresponding to the page buffer groups outputted from the sensing circuit.

4. The semiconductor memory device of claim 1, wherein the verifying result signal generation section further includes:

a processing circuit for outputting a third verifying signal for showing a number of the page buffer groups to which fail of the program occurs according to the pass/fail signals corresponding to the page buffer groups outputted from the sensing circuit.

5. The semiconductor memory device of claim 4, wherein the processing circuit includes plural multiplexers and flip-flops, and wherein the flip-flops are coupled between the multiplexers, the multiplexers output a signal inputted to a first input terminal or a second input terminal through an output terminal in response to a mux control signal, a fail bit setting value is inputted to the first input terminal of each of the multiplexers, a ground voltage is coupled to the second input terminal of a first multiplexer, outputs of the flip-flops are inputted respectively to the second input terminals of other multiplexers except the first multiplexer, each of the input terminals of the flip-flops is coupled to the output of the multiplexer in previous stage, output terminals of the other flip-flops except the final flip-flop of the flip-flops are respectively coupled to the second input terminals of the multiplexers in next stage, and the final flip-flop outputs the third verifying signal.

6. The semiconductor memory device of claim 5, wherein the fail bit setting value is determined according to a number of the page buffer groups, and the fail bit setting values are set in sequence from the fail bit setting value inputted to the final multiplexer of the multiplexers, and wherein it is determined that a corresponding program is passed though fail of the program occurs to the page buffer groups by the number of the page buffer groups.

7. A semiconductor memory device comprising:

a memory cell array configured to include at least one memory cell;

page buffer groups coupled to at least one of the memory cells and configured to have at least one page buffer configured to operate for programming or reading the memory cell, and selected by a select signal;

a fail checking circuit configured to perform program verifying of the page buffer group selected by the select signal; and a control circuit configured to output the select signal to verify the memory cell is programmed after the programming of the memory cell is performed, and in response to an output signal of the fail checking circuit.

8. The semiconductor memory device of claim 7, wherein the sensing circuit is configured to output a pass/fail signal corresponding to a page buffer group.

9. The semiconductor memory device of claim 8, wherein the fail checking circuit includes a verifying result signal generation section configured to output one or more of a first verifying signal and a second verifying signal in accordance with passing or failing of a program corresponding to a total of page buffer groups by using the pass/fail signal.

* * * * *